United States Patent
Pass et al.

(10) Patent No.: US 11,923,474 B2
(45) Date of Patent: Mar. 5, 2024

(54) SOLAR CELL INTERCONNECTION

(71) Applicant: Maxeon Solar Pte. Ltd., Singapore (SG)

(72) Inventors: Thomas P. Pass, San Jose, CA (US); Gabriel Harley, Mountain View, CA (US); David Fredric Joel Kavulak, Fremont, CA (US); Richard Hamilton Sewell, Los Altos, CA (US)

(73) Assignee: Maxeon Solar Pte. Ltd., Singapore (SG)

( * ) Notice: Subject to any disclaimer, the term of this patent is extended or adjusted under 35 U.S.C. 154(b) by 13 days.

(21) Appl. No.: 15/834,452

(22) Filed: Dec. 7, 2017

(65) Prior Publication Data

US 2018/0102453 A1 Apr. 12, 2018

Related U.S. Application Data

(60) Continuation of application No. 15/410,560, filed on Jan. 19, 2017, now Pat. No. 9,865,759, which is a (Continued)

(51) Int. Cl.
*H01L 31/05* (2014.01)
*B23K 31/02* (2006.01)
(Continued)

(52) U.S. Cl.
CPC .......... *H01L 31/0512* (2013.01); *B23K 31/02* (2013.01); *H01L 31/05* (2013.01);
(Continued)

(58) Field of Classification Search
CPC ............ H01L 31/022441; H01L 31/05; H01L 31/0508; H01L 31/0512; H01L 31/0516; Y02E 10/50
See application file for complete search history.

(56) References Cited

U.S. PATENT DOCUMENTS 4,296,270 A * 10/1981 Kohler ................ H01L 31/0508
136/244
2001/0029975 A1 10/2001 Takeyama et al.
(Continued)

FOREIGN PATENT DOCUMENTS

CN 101375411 2/2009
CN 102347375 A 2/2012
(Continued)

OTHER PUBLICATIONS

Notice for Reasons for Refusal from Japanese Patent Application No. 2017-515216 dated Jul. 5, 2019, 10 pgs.
(Continued)

*Primary Examiner* — Lindsey A Buck
(74) *Attorney, Agent, or Firm* — Schwabe, Williamson & Wyatt, P.C.

(57) ABSTRACT

A solar cell can include a conductive foil having a first portion with a first yield strength coupled to a semiconductor region of the solar cell. The solar cell can be interconnected with another solar cell via an interconnect structure that includes a second portion of the conductive foil, with the interconnect structure having a second yield strength greater than the first yield strength.

21 Claims, 6 Drawing Sheets

Related U.S. Application Data division of application No. 14/496,226, filed on Sep. 25, 2014, now Pat. No. 9,559,233.

(51) Int. Cl.
*H01L 31/068* (2012.01)
*H01L 31/0745* (2012.01)
*H01L 31/18* (2006.01)

(52) U.S. Cl.
CPC ...... *H01L 31/0504* (2013.01); *H01L 31/0508* (2013.01); *H01L 31/0682* (2013.01); *H01L 31/0745* (2013.01); *H01L 31/18* (2013.01); *H01L 31/1876* (2013.01); *Y02E 10/50* (2013.01); *Y02E 10/547* (2013.01)

(56) References Cited

U.S. PATENT DOCUMENTS

| | | | |
|---|---|---|---|
| 2001/0029976 A1* | 10/2001 | Takeyama | H01L 31/0512 136/244 |
| 2009/0139557 A1* | 6/2009 | Rose | H01L 31/0516 136/244 |
| 2010/0018565 A1* | 1/2010 | Funakoshi | H01L 31/022433 136/244 |
| 2010/0108122 A1 | 5/2010 | Everson et al. | |
| 2010/0116323 A1 | 5/2010 | Katayama et al. | |
| 2010/0218824 A1 | 9/2010 | Luch | |
| 2011/0277817 A1* | 11/2011 | Ide | H01L 31/022441 136/246 |
| 2012/0080079 A1 | 4/2012 | Corneille et al. | |
| 2012/0103408 A1 | 5/2012 | Moslehi et al. | |
| 2012/0138135 A1* | 6/2012 | Manning | H01L 31/022441 136/256 |
| 2012/0192918 A1 | 8/2012 | Zhou et al. | |
| 2013/0312809 A1 | 11/2013 | Luch et al. | |
| 2014/0124014 A1 | 5/2014 | Morad et al. | |
| 2014/0190546 A1* | 7/2014 | Fukumochi | H01L 31/188 136/244 |
| 2015/0040961 A1* | 2/2015 | Ishii | H01L 31/0516 136/244 |

FOREIGN PATENT DOCUMENTS

| | | |
|---|---|---|
| CN | 102473786 A | 5/2012 |
| CN | 203300679 U | 11/2013 |
| EP | 2629339 | 8/2013 |
| JP | H08298334 | 11/1996 |
| JP | H11 243224 | 9/1999 |
| JP | 2005/129773 | 5/2005 |
| JP | 2008218578 A | 9/2008 |
| JP | 2010-010649 | 1/2010 |
| JP | 2010/073445 | 4/2010 |
| JP | 2010-087011 | 4/2010 |
| JP | 2010-245399 | 10/2010 |
| JP | 2012-049390 | 3/2012 |
| JP | 2013026378 A | 2/2013 |
| JP | 2014/192367 | 10/2014 |
| WO | WO 2011/028630 A2 | 3/2011 |
| WO | WO-2013031384 A1 * | 3/2013 ..... H01L 31/022441 |
| WO | WO-2013161810 A1 * | 10/2013 ............ H01L 31/05 |

OTHER PUBLICATIONS

First Office Action from the Chinese Patent Application No. 2015800521590 dated Jun. 1, 2018, 7 pgs.
Office Action for Taiwan Patent Application No. 104131671 dated May 6, 2019, 4 pgs.
Extended European Search Report from European Patent Application No. 15843948.9 dated Aug. 9, 2017, 7 pgs.
International Search Report and Written Opinion from PCT/US2015/051562 dated Feb. 23, 2016, 13 pgs.
FAI Pre-Interview Communication from U.S. Appl. No. 14/496,226 dated Feb. 5, 2016, 4 pgs.
International Preliminary Report on Patentability for PCT Patent Application No. PCT/US2015/051562 dated Apr. 6, 2017, 10 pgs.
Office Action from Taiwanese Patent Application No. 108147231 dated Jan. 9, 2020, 6 pgs.
Official Communication from European Patent Application No. 15843948.9 dated Dec. 22, 2020, 4 pgs.
Notice of Reasons for Refusal from JP Application No. 2019-220581, dated Dec. 23, 2020, 8 pgs. (with English translation).
Final Notice of Reasons for Refusal from JP Application No. 2019-220581, dated Jun. 4, 2021, 9 pgs.
First Office Action from Chinese Patent Application No. 2019101111201 dated Feb. 7, 2022, 16 pgs.
Notification of Provisional Rejection from Korean Patent Application No. 10-2017-7010713 dated Apr. 26, 2022, 7 pgs.
Notification of Provisional Rejection from Korean Patent Application No. 10-2022-7039190 dated Jun. 30, 2023, 9 pgs.

* cited by examiner

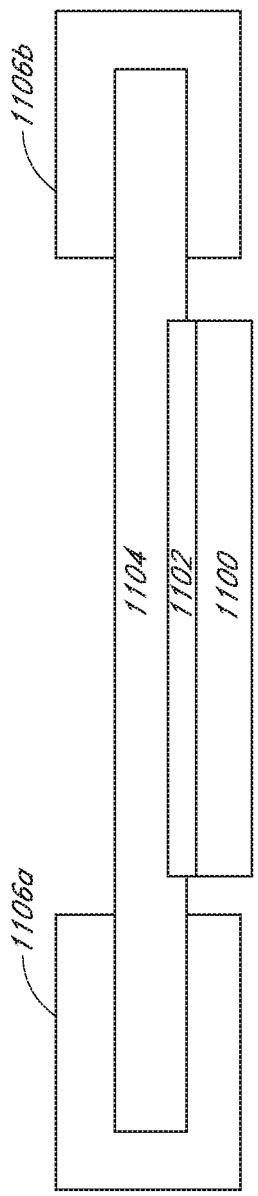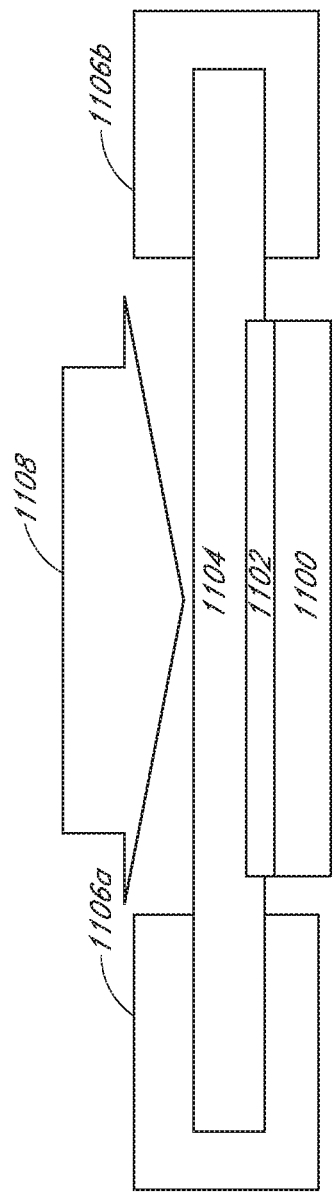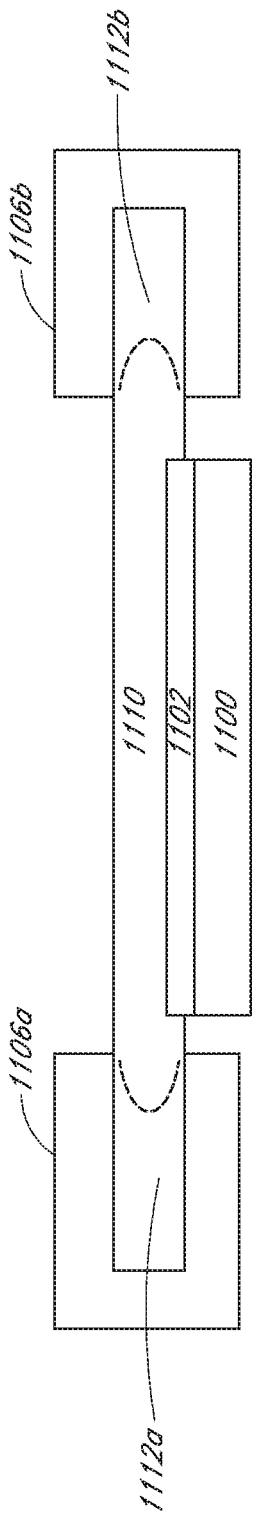

SOLAR CELL INTERCONNECTION

CROSS-REFERENCE TO RELATED APPLICATIONS

This application is a continuation of U.S. patent application Ser. No. 15/410,560, filed on Jan. 19, 2017, which is a divisional of U.S. patent application Ser. No. 14/496,226, filed on Sep. 25, 2014, the entire contents of which are hereby incorporated by reference herein.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit.

Solar cells can be interconnected together in series to provide a string of solar cells, which in turn can be connected in series to form a module. In some instances, interconnecting solar cells can be challenging.

BRIEF DESCRIPTION OF THE DRAWINGS

FIGS. 11-13 illustrate cross-sectional views of an example sequence for forming regions of conductive foil having different yield strengths, according to some embodiments.

DETAILED DESCRIPTION

Figure 1A:
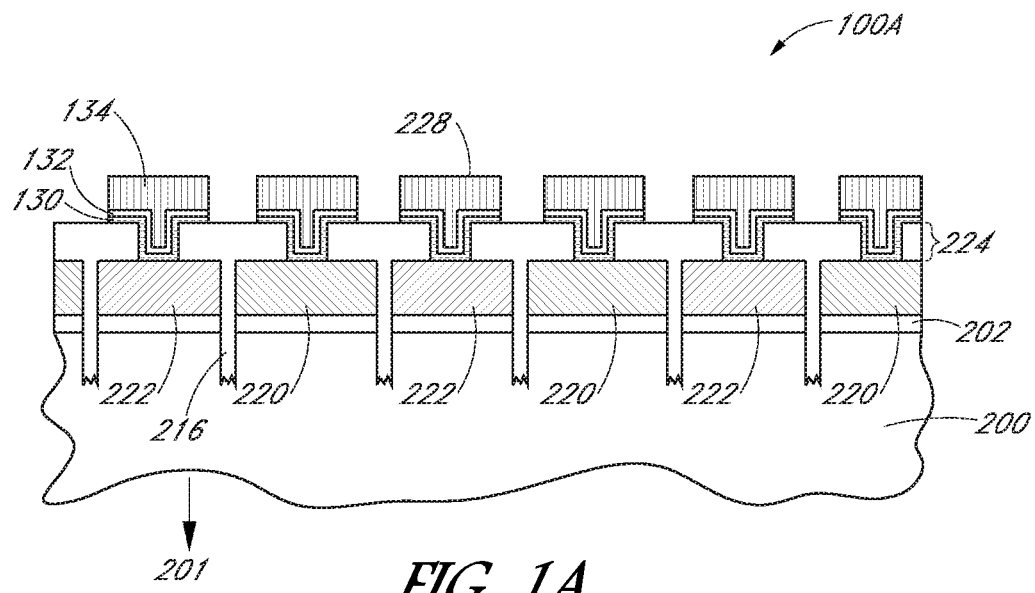
FIGS. 1A and 2A illustrate cross-sectional views of a portion of example solar cells having conductive contacts formed on emitter regions formed above a substrate, according to some embodiments.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" portion of a conductive foil does not necessarily imply that this portion is the first portion in a sequence; instead the term "first" is used to differentiate this portion from another portion (e.g., a "second" portion).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Although many of the examples described herein are back contact solar cells, the techniques and structures apply equally to other (e.g., front contact) solar cells as well. Moreover, although much of the disclosure is described in terms of solar cells for ease of understanding, the disclosed techniques and structures apply equally to other semiconductor structures (e.g., silicon wafers generally).

Solar cell interconnects and methods of forming solar cell interconnects are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography techniques, are not described in detail in order to not unnecessarily obscure embodiments of the present disclosure. Furthermore, it is to be understood that the various embodiments shown in the figures are illustrative representations and are not necessarily drawn to scale.

This specification first describes example solar cells that can be interconnected with the disclosed interconnects, followed by a more detailed explanation of various embodiments of interconnect structures. The specification then includes description of example methods for forming the interconnect structures. Various examples are provided throughout.

In a first example solar cell, a conductive foil is used to fabricate contacts, such as back-side contacts, for a solar cell having emitter regions formed above a substrate of the solar cell. For example, FIG. 1A illustrates a cross-sectional view of a portion of a solar cell having conductive contacts formed on emitter regions formed above a substrate, in accordance with an embodiment of the present disclosure. In various embodiments, the conductive foil is also used to form an interconnect structure that has a higher yield strength than the conductive foil of the conductive contacts, as described in more detail below.

Some challenges exist in coupling conductive foil to the solar cell and to interconnect conductive foil of adjacent cells. As one example, ratcheting can occur which can reduce reliability and lifetime of a solar cell and modules. Ratcheting is a form of plastic deformation of metal that is characterized by non-planar distortion of the foil, which can lead to reliability issues in the field. As another example, wafer bowing can occur due to thermal stress mismatch between materials (e.g., between silicon and metal) and can cause trouble with processing (e.g., alignment) and handling. The relationship between the yield stress of the metal and the impact on both ratcheting and bowing is opposite. For instance, high yield stress metal can be good for ratcheting but bad for bow. The inverse is true for low yield stress metal. The disclosed structures and techniques can inhibit wafer bowing and ratcheting and result in improved lifetime and performance of the resulting solar cells and modules.

Referring to FIG. 1A, a portion of solar cell 100A includes patterned dielectric layer 224 disposed above a plurality of n-type doped polysilicon regions 220, a plurality of p-type doped polysilicon regions 222, and on portions of substrate 200 exposed by trenches 216. Conductive contacts 228 are disposed in a plurality of contact openings disposed in dielectric layer 224 and are coupled to the plurality of n-type doped polysilicon regions 220 and to the plurality of p-type doped polysilicon regions 222.

In one embodiment, the plurality of n-type doped polysilicon regions 220 and the plurality of p-type doped polysilicon regions 222 can provide emitter regions for solar cell 100A. Thus, in an embodiment, conductive contacts 228 are disposed on the emitter regions. In an embodiment, conductive contacts 228 are back contacts for a back-contact solar cell and are situated on a surface of the solar cell opposing a light receiving surface (direction provided as 201 in FIG. 1A) of solar cell 100A. Furthermore, in one embodiment, the emitter regions are formed on a thin or tunnel dielectric layer 202.

In some embodiments, as shown in FIG. 1A, fabricating a back-contact solar cell can include forming thin dielectric layer 202 on the substrate. In one embodiment, a thin dielectric layer is composed of silicon dioxide and has a thickness approximately in the range of 5-50 Angstroms. In one embodiment, thin dielectric layer performs as a tunnel oxide layer. In an embodiment, the substrate is a bulk monocrystalline silicon substrate, such as an n-type doped monocrystalline silicon substrate. However, in another embodiment, the substrate includes a polycrystalline silicon layer disposed on a global solar cell substrate.

Trenches 216 can be formed between n-type doped polysilicon (or amorphous silicon) regions 220 and p-type doped polysilicon regions 222. Portions of trenches 216 can be texturized to have textured features. Dielectric layer 224 can be formed above the plurality of n-type doped polysilicon regions 220, the plurality of p-type doped polysilicon regions 222, and the portions of substrate 200 exposed by trenches 216. In one embodiment, a lower surface of dielectric layer 224 can be formed conformal with the plurality of n-type doped polysilicon regions 220, the plurality of p-type doped polysilicon regions 222, and the exposed portions of substrate 200, while an upper surface of dielectric layer 224 is substantially flat. In a specific embodiment, the dielectric layer 224 is an anti-reflective coating (ARC) layer.

A plurality of contact openings can be formed in dielectric layer 224. The plurality of contact openings can provide exposure to the plurality of n-type doped polysilicon regions 220 and to the plurality of p-type doped polysilicon regions 222. In one embodiment, the plurality of contact openings is formed by laser ablation. In one embodiment, the contact openings to the n-type doped polysilicon regions 220 have substantially the same height as the contact openings to the p-type doped polysilicon regions 222.

Forming contacts for the back-contact solar cell can include forming conductive contacts 228 in the plurality of contact openings 226 and coupled to the plurality of n-type doped polysilicon regions 220 and to the plurality of p-type doped polysilicon regions 222. Thus, in an embodiment, conductive contacts 228 are formed on or above a surface of a bulk N-type silicon substrate 200 opposing a light receiving surface 201 of the bulk N-type silicon substrate 200. In a specific embodiment, the conductive contacts are formed on regions (222/220) above the surface of the substrate 200.

Still referring to FIG. 1A, conductive contacts 228 can include a conductive foil 134. In various embodiments, conductive foil can be aluminum, copper, other conductive materials, and/or a combination thereof. In some embodiments, as shown in FIG. 1A, conductive contacts 228 can also include one or more conductive (metal or otherwise) regions, such as regions 130 and 132 in FIG. 1A, between conductive foil 134 and a respective semiconductor region. For example, a first conductive region 130 can include (e.g., aluminum, aluminum/silicon alloy, etc.), which can be printed, or blanket deposited (e.g., sputtered, evaporated, etc.).

Figure 1B:
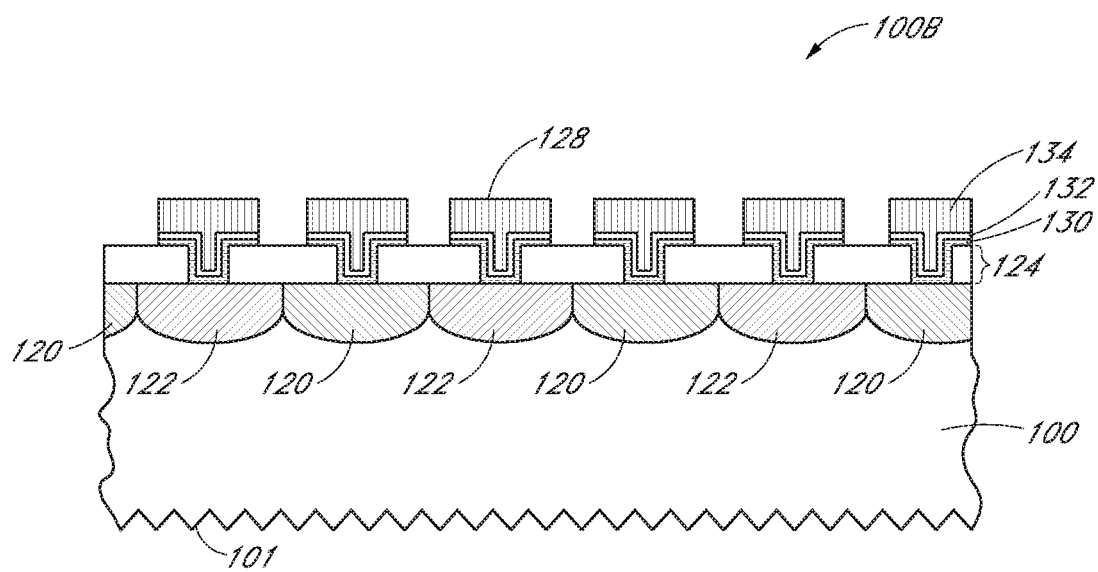
FIGS. 1B and 2B illustrate cross-sectional views of a portion of example solar cells having conductive contacts formed on emitter regions formed in a substrate, according to some embodiments.

In one embodiment, the conductive foil 134 and the one or more conductive regions 130 and 132 can be welded, thermally compressed, or otherwise coupled to the semiconductor region of the solar cell and therefore in electrical contact with the emitter regions of the solar cell 100A. As described herein, in some embodiments, as shown in FIGS. 1A and 1B, one or more conductive regions (e.g., sputtered, evaporated, or printed aluminum, nickel, copper, etc.) may exist between the conductive foil and the emitter regions. Thermally compressed conductive foil is used herein to refer to the a conductive foil that has been heated at a temperature at which plastic deformation can occur and to which mechanically pressure has been applied with sufficient force such that the foil can more readily adhere to the emitter regions and/or conductive regions.

In some embodiments, the conductive foil 134 can be aluminum (Al) foil, whether as pure Al or as an alloy (e.g., Al/Silicon (Al/Si) alloy foil). In one embodiment, the conductive foil 134 can also include non-Al metal. Such non-Al metal can be used in combination with or instead of Al particles. Although much of the disclosure describes metal foil and metal conductive regions, note that in some embodiments, non-metal conductive foil (e.g., conductive carbon) and non-metal conductive regions can similarly be used in addition to or instead of metal foil and metal conductive regions. As described herein, metal foil can include Al, Al—Si alloy, tin, copper, and/or silver, among other examples. In some embodiments, conductive foil can be less than 5 microns thick (e.g., less than 1 micron), while in other embodiments, the foil can be other thicknesses (e.g., 15 microns, 25 microns, 37 microns, less than 50 microns, etc.) In some embodiments, the type of foil (e.g., aluminum, copper, tin, etc.) can influence the thickness of foil needed to achieve sufficient current transport across the solar cell. Moreover, in embodiments having one or more additional conductive regions 130 and 132, the foil can be thinner than in embodiments not having those additional conductive regions.

Moreover, in various embodiments, the type and/or thickness of the conductive foil can affect the yield strength of the portion of the conductive foil coupled to the solar cell and the portion of the conductive foil that overhangs the edge of the solar cell and is part of the interconnect structure.

In various embodiments, conductive regions 130 and 132 can be formed from a metal paste (e.g., a paste that includes the metal particles as well as a binder such that the paste is printable), from a metal powder (e.g., metal particles without a binder, a powder of Al particles, a layer of Al particles and a layer of Cu particles), or from a combination of metal paste and metal powder. In one embodiment using metal paste, paste may be applied by printing (e.g., screen printing, ink-jet printing, etc.) paste on the substrate. The paste may include a solvent for ease of delivery of the paste and may also include other elements, such as binders or glass frit.

In various embodiments, the metal particles can be fired (before and/or after the conductive foil and conductive regions are coupled together), also referred to as sintering, to coalesce the metal particles together, which can enhance conductivity and reduce line resistance thereby improving the performance of the solar cell. But heating from firing or the bonding process can also reduce the yield strength of the conductive foil, which can reduce reliability and lifetime of the solar module from ratcheting. Accordingly, techniques and structures disclosed herein can provide for a sufficiently low yield strength for the conductive foil over the solar cell to inhibit bowing yet also provide for a sufficiently high yield strength of the foil of the interconnect structure so as to inhibit ratcheting.

Turning now to FIG. 1B, a cross-sectional view of a portion of an example solar cell having conductive contacts formed on emitter regions formed in a substrate is illustrated, according to one embodiment. For example, in this second exemplary cell and similar to the example of FIG. 1A, conductive foil can be used to fabricate contacts, such as back-side contacts, for a solar cell having emitter regions formed in a substrate of the solar cell.

As shown in FIG. 1B, a portion of solar cell 100B includes patterned dielectric layer 124 disposed above a plurality of n-type doped diffusion regions 120, a plurality of p-type doped diffusion regions 122, and on portions of substrate 100, such as a bulk crystalline silicon substrate. Conductive contacts 128 are disposed in a plurality of contact openings disposed in dielectric layer 124 and are coupled to the plurality of n-type doped diffusion regions 120 and to the plurality of p-type doped diffusion regions 122. In an embodiment, diffusion regions 120 and 122 are formed by doping regions of a silicon substrate with n-type dopants and p-type dopants, respectively. Furthermore, the plurality of n-type doped diffusion regions 120 and the plurality of p-type doped diffusion regions 122 can, in one embodiment, provide emitter regions for solar cell 100B. Thus, in an embodiment, conductive contacts 128 are disposed on the emitter regions. In an embodiment, conductive contacts 128 are back contacts for a back-contact solar cell and are situated on a surface of the solar cell opposing a light receiving surface, such as opposing a texturized light receiving surface 101, as depicted in FIG. 1B.

In one embodiment, referring again to FIG. 1B and similar to that of FIG. 1A, conductive contacts 128 can include a conductive foil 134 and in some embodiments, one or more additional conductive regions, such as conductive regions 130 and 132. The conductive foil 134, and the one or more conductive regions can be coupled (e.g., welded, thermally compressed, or otherwise) to the semiconductor region of the solar cell and/or to one or more conductive regions between the foil and the semiconductor region and therefore in electrical contact with the emitter regions of the solar cell 100A. The conductive contact description of FIG. 1A applies equally to the conductive contact of FIG. 1B but is not repeated for clarity of description.

Figure 2A:
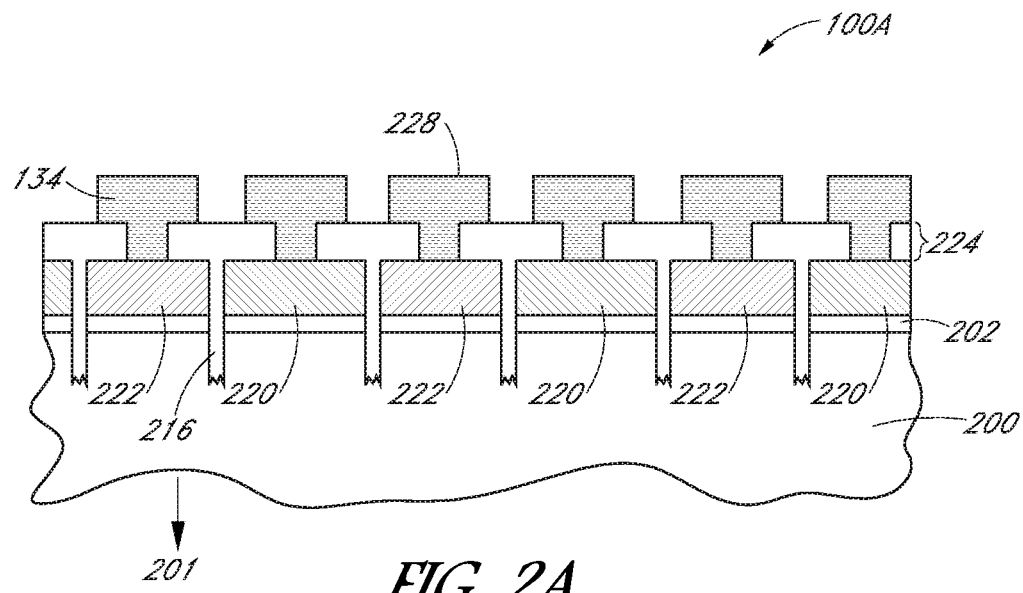

Turning now to FIG. 2A, the illustrated solar cell includes the same features as the solar cell of FIG. 1A except that the example solar cell of FIG. 2A does not include the one or more additional conductive regions (regions 130 and 132 of FIG. 1A). Instead, conductive foil 134 is bonded directly to the semiconductor region of the solar cell.

Figure 2B:
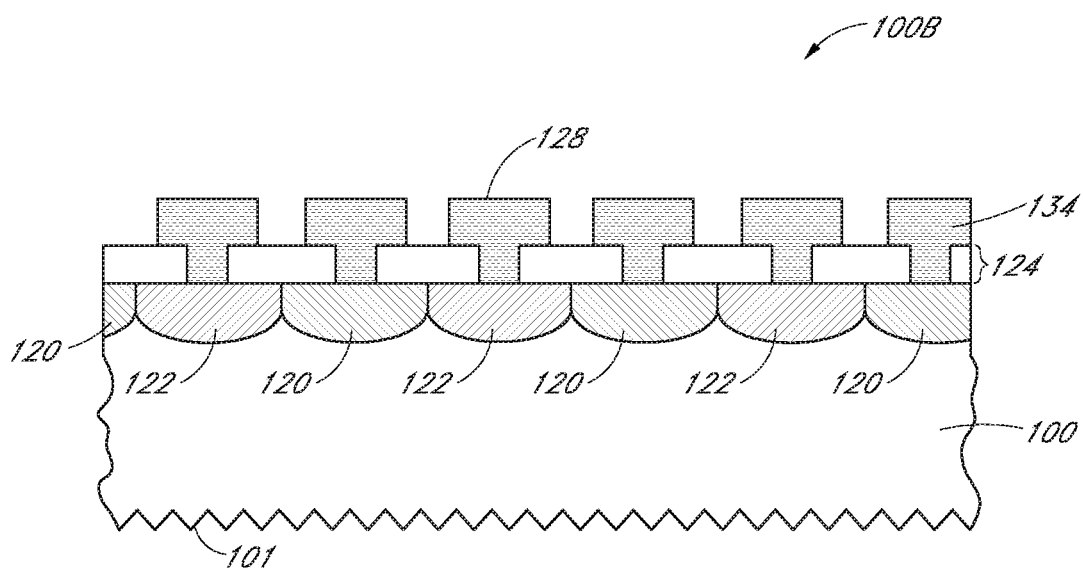

Similarly, the illustrated solar cell of FIG. 2B includes the same features as the solar cell of FIG. 1B except that the example solar cell of FIG. 2B does not include the one or more additional conductive regions (regions 130 and 132 of FIG. 1B). Instead, conductive foil 134 is bonded directly to the semiconductor region of the solar cell.

Although certain materials are described herein, some materials may be readily substituted with others with other such embodiments remaining within the spirit and scope of embodiments of the present disclosure. For example, in an embodiment, a different material substrate, such as a group III-V material substrate, can be used instead of a silicon substrate.

Note that, in various embodiments, the formed contacts need not be formed directly on a bulk substrate, as was described in FIGS. 1B and 2B. For example, in one embodiment, conductive contacts such as those described above are formed on semiconducting regions formed above (e.g., on a back side of) as bulk substrate, as was described for FIGS. 1A and 2A.

In various embodiments, the conductive foil of solar cells of FIGS. 1A-1B and 2A-2B includes an overhang region (e.g., tab) that extends beyond the edge of the cell and can be coupled to an overhang region of an adjacent cell to interconnect the two cells together. In some embodiments, the overhang portion of a particular solar cell can extend less than 2 mm over its edge.

Turning now to FIGS. 3-8, various examples of solar cell interconnect structures configured to inhibit ratcheting and wafer bowing are illustrated.

Figure 3:
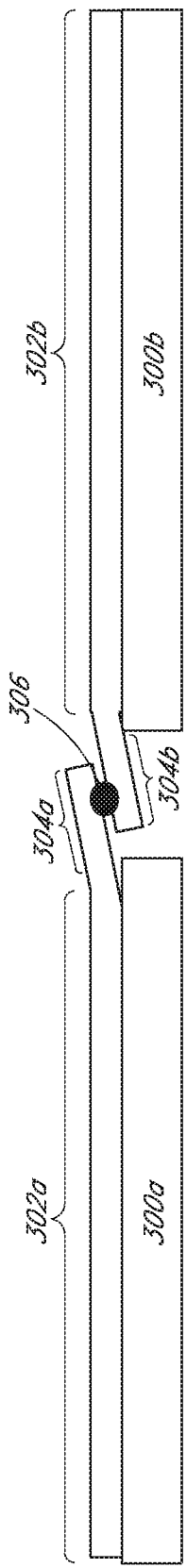
FIGS. 3-6 illustrate cross-sectional views of various example solar cell interconnections, according to some embodiments.

FIG. 3 illustrates two solar cells, solar cells 300a and 300b, coupled together via an interconnect structure. In the illustrated example, a portion 302a of a conductive foil is coupled to solar cell 300a and a portion 302b of another conductive foil is coupled to solar cell 300b. The interconnect structure can include overhang portions 304a and 304b of the conductive foils. As shown, the overhang portions 304a and 304b can be coupled via one or more joints 306, which can be formed via laser or electrical welding, soldering, or some other technique. In various embodiments, the portions of the conductive foils disposed above and coupled to the solar cells have a lower yield stress than the yield stress of the interconnect structure. Accordingly, the portion of the conductive foil that includes lower yield stress metal, which can help inhibit wafer bowing, is the portion that is coupled to the wafer. And the portion of the foil that is used to form the interconnect structure can be higher yield stress metal, which can inhibit ratcheting. Accordingly, such a foil can inhibit both wafer bowing and ratcheting. One example technique to form dual tempered conductive foil is described at FIGS. 10-13.

Figure 4:
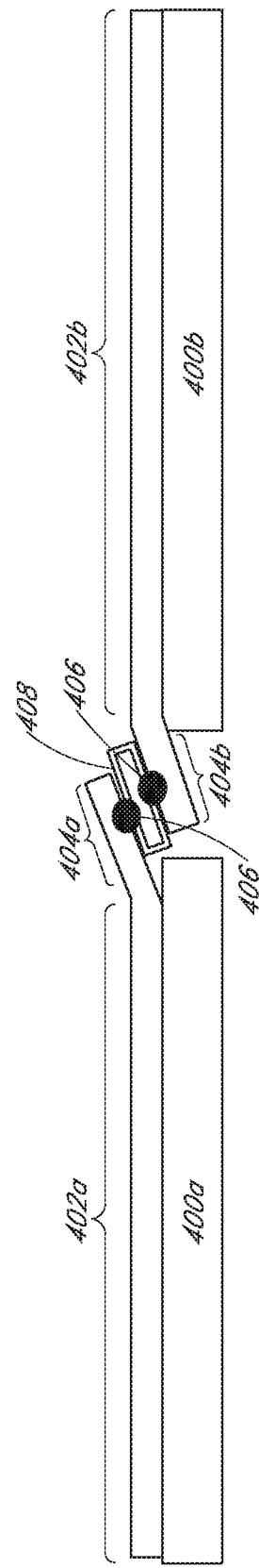

FIG. 4 illustrates another example interconnect structure. Similar to FIG. 3, a portion 402a of a conductive foil is coupled to solar cell 400a and a portion 402b of another conductive foil is coupled to solar cell 400b. In contrast to FIG. 3, the interconnect structure of FIG. 4 includes an additional material 408 coupled to and between overhang portions 404a and 404b. In one embodiment, additional material 408 can be a material such that the collective yield strength of the interconnect structure is high enough to inhibit ratcheting. In one embodiment, the conductive foils, including the portions disposed over and coupled to the solar cells and the overhang portions, have a lower yield strength to inhibit bowing. The additional material, however, can have sufficiently high yield strength such that, when added to the lower yield strength foil of the overhang portions, the collective interconnect structure has a high enough yield strength to inhibit ratcheting.

In various embodiments in which additional material 408 is positioned between the overhang tabs, as in FIG. 4, additional material 408 is a conductive material. It can be the same material as the overhang tabs (e.g., soft aluminum overhang tabs, and hard aluminum additional material) or different.

Figure 5:
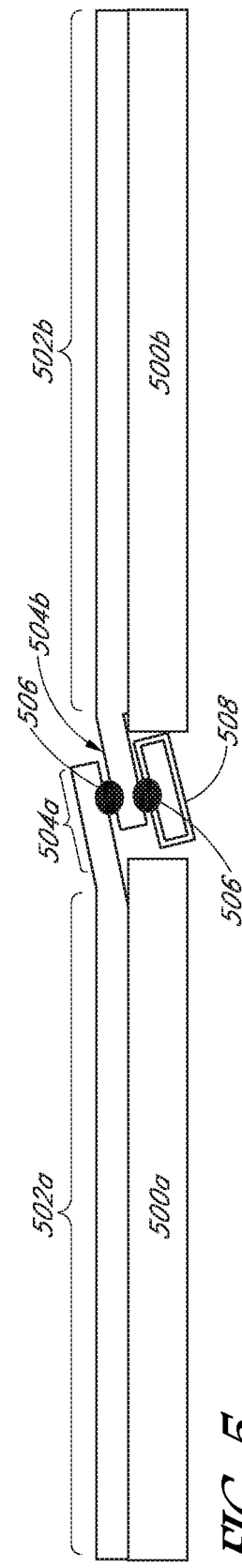

FIG. 5 illustrates another example interconnect structure for use in interconnecting solar cells. The interconnect structure is similar to the interconnect structure of FIG. 4 except that the additional material 508 is not between overhang portions 504a and 504b. Instead, in the example of FIG. 5, additional material 508 is disposed between solar cells 500a and 500b, which can provide and/or maintain a consistent spacing or gap between the solar cells. For a back contact solar cell, additional material 508 is located on the sunny side of the interconnect structure and can be visible from the sunny side of a solar module. Accordingly, in one embodiment, the additional material 508 can be colored or otherwise made such that the visible portion of the interconnect structure, as viewed from the front of the module, is a similar color to the solar cells and therefore blends in.

In some embodiments, additional material 508 can be a conductive material or in some instances, it can be a non-conductive material as long as the additional material 508 can be coupled (e.g., welded, soldered, wrapped around, tied around, etc.) to the overhang tabs and as long as the interconnect structure collectively has sufficient yield strength to inhibit ratcheting.

Various other examples also exist. For example, in one embodiment, instead of the additional material being on the front side of the overhang tabs or between the overhang tabs, the additional material can be on the back side of the overhang tabs. In another embodiment, the additional material can be wrapped around the overhang tabs and then coupled to the overhang tabs to form the interconnect structure.

Figure 6:
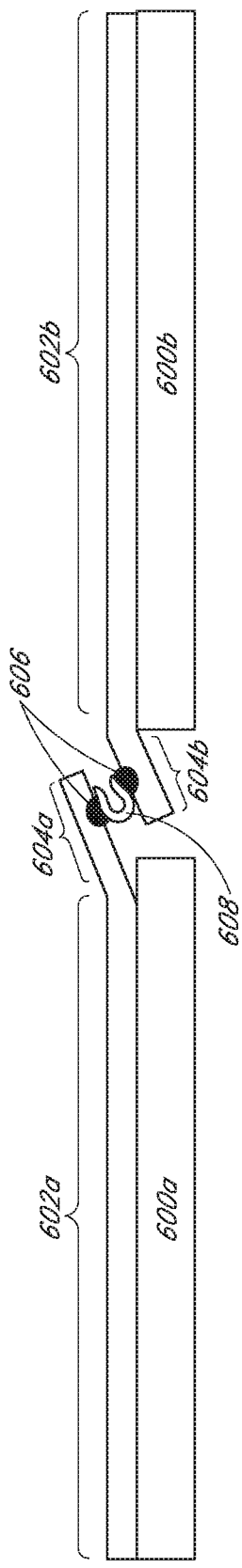

In the examples of FIGS. 4 and 5, the additional material is shown at a non-zero angle relative to the solar cells. In some embodiments, the additional material can be coupled such that the interconnect structure is slightly out of plane from the solar cell, which can result in strain relief for the interconnect structure, thereby further inhibiting ratcheting. Other examples of stress relief interconnect structures also exist. One such example is illustrated in FIG. 6. As shown in FIG. 6, additional material 608 includes a bend (e.g., c-shaped bend) such that additional material is coupled separately to each overhang tab. Such an interconnect structure can result in improved strain relief and further inhibit ratcheting. Although the illustrated additional material shows a two-axis bend, in some embodiments, the bend can be a three-axis bend.

The additional material of the interconnect structure can be a variety of shapes. The interconnect structure can be a simple ribbon, a channel shape (e.g., for additional stiffness), a bowtie shape (for aesthetics and connection in the diamond areas of the module). The additional material can have other materials or properties to modify the joint or reliability. Such materials or properties include coating for corrosion protection (e.g., metal, oxide, or nitride) or for use in coupling to foil (e.g., solder coating on the additional material), adhesive properties for adhesion to module materials (e.g., encapsulant) or to the overhang portions (e.g., solder material coating), or multiple layers for different expansion and contraction properties.

Figure 8:
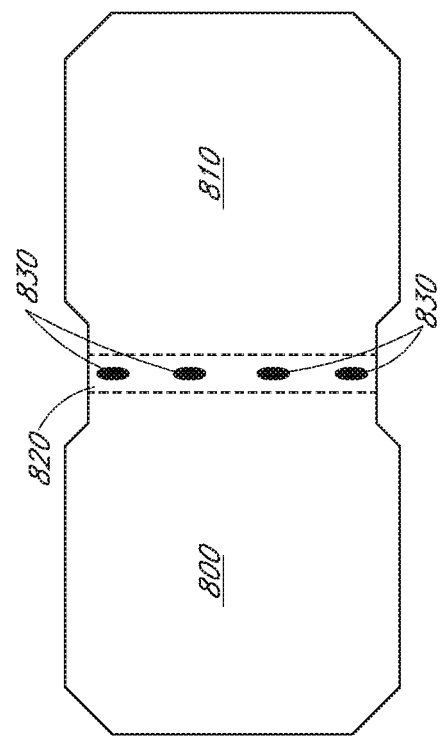
FIGS. 7 and 8 illustrate top-down views of various example solar cell interconnections, according to some embodiments.
Figure 7:
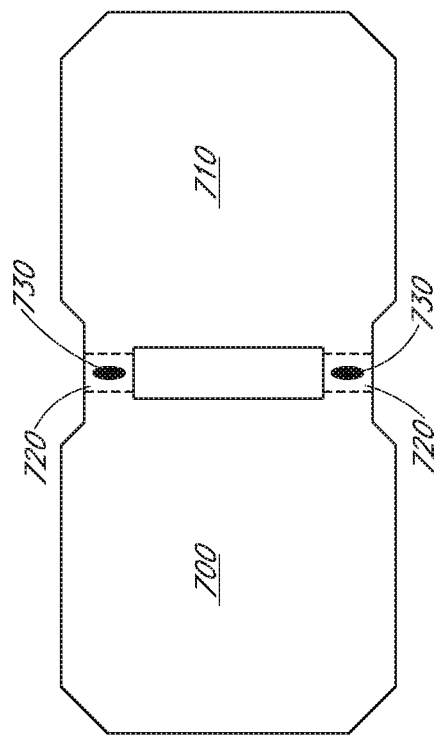

FIGS. 7 and 8 illustrate example interconnected solar cells, according to various embodiments. For ease of explanation, the metal on solar cells 700 and 710 is not illustrated as patterned (e.g., finger pattern). As shown, solar cells 700 and 710 are interconnected via multiple interconnect structures 720 at the corners of the solar cells. The right-most dashed lines illustrate the edge of the overhang tab from the conductive foil of the left solar cell and the left-most dashed lines illustrate the edge of the overhang tab from the conductive foil of the right solar cell. In some embodiments, joint 730 can be a weld joint, solder joint, or some other coupling, and can be the location at which the overlapping overhang tabs are coupled together.

As shown in the example of FIG. 8, instead of interconnecting the solar cells at their respective corners, the solar cells are connected at the overlapping overhang edges 820 of the solar cells with a plurality of interconnect joints 830. In one embodiment, one or more of the interconnect joints 830 can correspond to a separate piece of additional material, such as a separate piece of hard foil. Or, in one embodiment, a continuous piece of additional material can be above, between, or under the overlapping edges and coupled to the overlapping overhang edges at the locations of interconnect joints 830. In some embodiments, however, such as in the embodiment of FIG. 3, no additional material is used. In such embodiments, joints 730 and 830 can simply be regions in which one overhang foil is coupled to another.

In one embodiment, one or more stress relief features can be added to the interconnect structure after it has been formed. For example, in one embodiment, one or more relief cutouts can be formed in the interconnect structure to further relieve stress.

Figure 9:
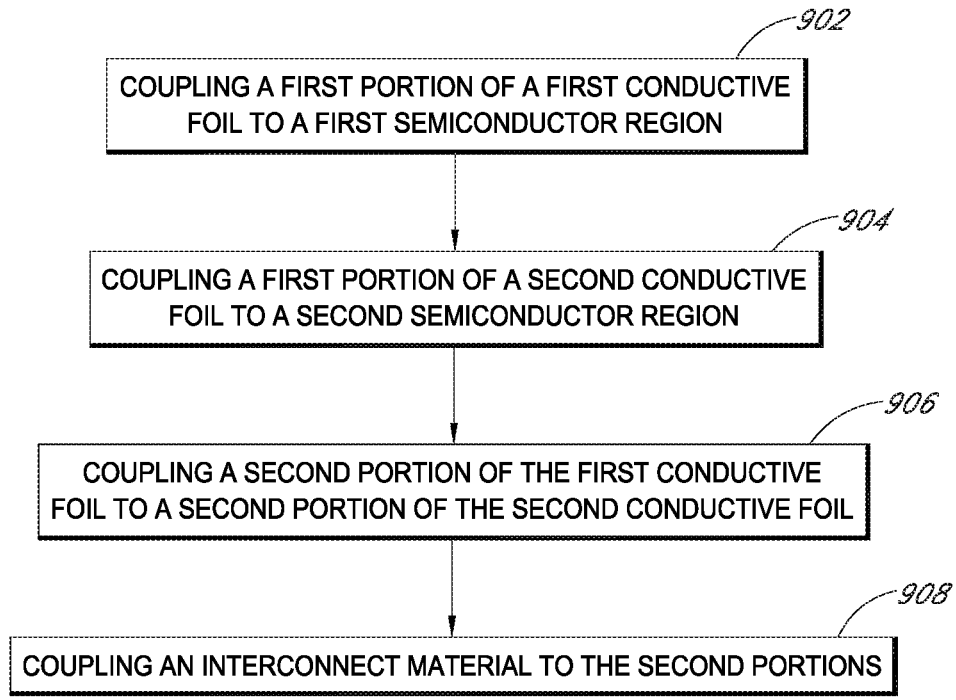
FIG. 9 is a flowchart illustrating an example method of interconnecting solar cells, according to some embodiments.

Turning now to FIG. 9, a flow chart illustrating a method for forming a solar cell interconnect region is shown, according to some embodiments. In various embodiments, the method of FIG. 9 may include additional (or fewer) blocks than illustrated. For example, in some embodiments, coupling an interconnect material to the overhang tabs, as shown at block 908, may not be performed.

As shown at 902, a portion of a conductive foil can be coupled to a solar cell. For example, in one embodiment, a portion of the conductive foil disposed over the solar cell can be coupled to a semiconductor region of the solar cell. Coupling can be achieved by laser or thermal welding, soldering, thermocompression, among other techniques.

As illustrated at 904, a portion of another conductive foil can be coupled to another solar cell. Similar to the description at block 902, in one embodiment, a portion of the other conductive foil disposed over the other solar cell can be coupled to a semiconductor region of the other solar cell. As was the case with block 902, coupling can be achieved by laser or thermal welding, soldering, thermocompression, among other techniques. In various embodiments, blocks 902 and 904 can be performed sequentially or can be processed at substantially the same time.

At 906, other portions of the conductive foils can be coupled together to form an interconnect structure. In one embodiment, the other portions are overhang portions that extend past the edge of the solar cells. Various examples are illustrated in FIGS. 3-8. The overhang portions can at least partially overlap and the overlapping regions can be welded, soldered, or otherwise coupled together such that the cells are electrically and mechanically interconnected together.

In some embodiments, the overhang portion of the foils can have higher yield strength than the portion of the foil disposed over and coupled to the solar cell such that wafer bowing and ratcheting can be inhibited. In one embodiment, the foil can be fabricated or modified to be dual tempered, such that the overhang portion is a hard foil and the solar cell portion is a soft foil. FIGS. 10-13 illustrate one example embodiment or modifying the foil to be dual tempered.

In some embodiments, however, an additional material can be coupled to the overhang foil portions to form the interconnect having the higher yield strength as illustrated at 908. For example, in one embodiment, the additional material can be placed between the overhang foil portions or on the front or back side of the overhang foil portions and the additional material, and both overhang foil portions can be coupled together to collectively form the interconnect. As one simple example, the overhang portions may be the same lower yield strength, soft foil as the solar cell portions of the foil but the additional material may have high enough yield strength to make the overall interconnect structure have a sufficiently high yield strength to inhibit ratcheting.

In one embodiment, the coupling of the two overhang portions and the coupling of the additional material at block 906 and 908 can be performed substantially simultaneously, or block 906 can be performed first, or block 908 can be performed first. As one example, the additional material can be welded to one of the overhang portions first, and then the other overhang portion can be welded to the already welded overhang portion and additional material. Other variations also exist.

In some embodiments, the additional material is conductive whereas in other embodiments, the additional material may not be conductive or may not be as conductive as the foil. In such embodiments, the overhang portions may make direct contact to one another without the additional material being between the overhang portions. In such embodiments, the additional material can provide mechanical integrity and allow for sufficient yield strength to inhibit ratcheting but may not be relied upon to carry current from one cell to the other.

Figure 10:
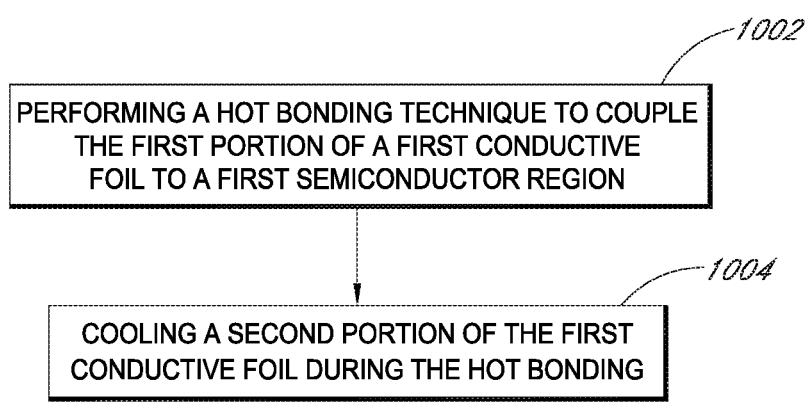
FIG. 10 is a flowchart illustrating an example method of forming regions of conductive foil having different yield strengths, according to some embodiments.

Turning now to FIG. 10, a flow chart illustrating a method for forming a dual tempered conductive foil is shown, according to some embodiments. In various embodiments, the method of FIG. 10 may include additional (or fewer) blocks than illustrated.

As shown at 1002, a hot bonding technique can be performed to couple a portion of a conductive foil to a solar cell. Similar to blocks 902 and 904 of FIG. 9, in one embodiment, a portion of the conductive foil disposed over the solar cell can be coupled to a semiconductor region of the solar cell. Hot bonding techniques include thermocompression bonding and heated welding. For thermocompression bonding, the conductive foil can be heated to temperatures above 200 degrees Celsius and mechanical force (e.g., via plate, roller, etc.) can be applied with pressure of at least 1 psi.

In one embodiment, the conductive foil used in the method of FIG. 10 is a hard foil with high yield strength before the hot bonding technique is applied. One example hard foil is 7020 Series Aluminum foil but other hardness Al foils or other non-Al foils can be used.

As illustrated at 1004, a second portion of the conductive foil, which can be a portion that corresponds to overhang portions that extend past the edge of the solar cell, can be cooled during the hot bonding technique of block 1002. The result of blocks 1002 and 1004 is that the original hard, higher yield strength conductive foil is softened and modified into a lower yield strength foil in the portion over the solar cell as it is coupled to the solar cell to inhibit wafer bowing yet substantially retains its hardness in the overhang portions of the foil to inhibit ratcheting once interconnected.

Clamping the overhang portions to cool them can be difficult, especially when the overhang portions may only extend 2 mm or less past the edge of the solar cell. In one embodiment, a larger overhang portion may exist during the dual tempering process and the overhang portion may then be trimmed after the foil has been tempered. For example, during the dual tempering process, the overhang portions may extend about 10 mm past the edges of the wafer such that the overhang portion is sufficiently enough for the clamp to hold the overhang portion. After the dual tempering process, the overhang portions can then be trimmed to a small length (e.g., 2 mm long, 1 mm, etc.).

FIGS. 11-13 illustrate cross-sectional views of portions of an example dual tempering technique. As shown in FIG. 11, wafer 1102 can be located on a surface 1100, such as a wafer chuck. In one embodiment, surface 1100 can be heated during the process to help the foil bond to the solar cell. Hard foil 1104 can be placed on wafer 1102 (e.g., on a backside of the wafer for a back contact solar cell) and clamped via clamps 1106a and 1106b. Not illustrated, the foil can be pressed, vacuumed, or otherwise be mechanically held in place and sufficiently taut.

FIG. 12 illustrates a hot bond 1108 being applied to the portion of the foil over the solar cell. At the same time, clamps 1106a and 1106b can be cooled (e.g., air chilled, water or coolant chilled, etc.) such that the heat from hot bond 1108 does not transfer enough to the overhang portions of the foil to lower the yield strength of the overhang portions.

Instead, as shown at FIG. 13, the resulting foil includes a lower yield strength portion 1110 disposed over and bonded to the solar cell 1102 and higher yield strength overhang portions 1112a and 1112b, each of which can be coupled to an overhang portion of a respective adjacent solar cell to electrically interconnect the cells but also be stiff enough to inhibit ratcheting. In one embodiment, the interconnect structure can simply be the coupled together higher yield strength overhang portions or it can also include the additional material as described herein.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The invention claimed is:

1. A photovoltaic ("PV") string, comprising:
    a first solar cell coupled to a first conductive foil and comprising first doped polysilicon regions disposed over or on a back side of a substrate of the first solar cell, wherein the first conductive foil includes a single layer of material having a first portion and a second portion, wherein the first portion of the first conductive foil is coupled to the first doped polysilicon regions of the first solar cell, and wherein the second portion of the first conductive foil extends beyond an edge of the substrate of the first solar cell;
    a second solar cell coupled to a second conductive foil and comprising second doped polysilicon regions disposed over or on a back side of a substrate of the second solar cell, wherein the second conductive includes a single layer of material having a first portion and a second portion, wherein the first portion of the second conductive foil is coupled to the second doped polysilicon regions of the second solar cell and wherein the second portion of the second conductive foil extends beyond an edge of the substrate of the second solar cell, and wherein the second portion of the first conductive foil overlaps the second portion of the second conductive foil;
    a plurality of joints between and directly coupling the second portion of the first conductive foil and the second portion of the second conductive foil, wherein the plurality of joints is along a line parallel to the spacing between the substrate of the first solar cell and the substrate of the second solar cell, the plurality of joints along an axis between and parallel with adjacent edges of the first solar cell and the second solar cell; and
    a cutout through the second portion of the first conductive foil and the second portion of the second conductive foil, the cutout intervening between a first of the plurality of joints and a second of the plurality of joints along the axis, and the cutout having a lateral width between the adjacent edges of the first solar cell and the second solar cell that is greater than an extent of overlap of the second portion of the first conductive foil and the second portion of the second conductive foil between the adjacent edges of the first solar cell and the second solar cell from a plan view perspective.

2. The PV string of claim 1 further comprising:
    a third portion of the first conductive foil, the third portion extending from the edge of the first solar cell;
    a third portion of the second conductive foil, the third portion extending from the edge of the second solar cell; and
    one or more joints coupling the third portion of the first conductive foil and the third portion of the second conductive foil.

3. The PV string of claim 1, wherein the first conductive foil has a thickness of less than or equal to 50 microns.

4. The PV string of claim 1, wherein the second portion of the first conductive foil extends less than 2 mm from the edge of the first solar cell.

5. The PV string of claim 1, wherein the first conductive foil includes aluminum.

6. The PV string of claim 1, further comprising:
    a gap between the first solar cell and the second solar cell.

7. The PV string of claim 1, wherein the plurality of joints comprises a region selected from a group consisting of a weld region, a solder region and a thermally compressed region.

8. A photovoltaic ("PV") string, comprising:
    a first solar cell coupled to a first conductive foil and comprising first doped polysilicon regions disposed over or on a back side of a substrate of the first solar cell, wherein the first conductive foil includes a single layer of material having a first portion and a second portion, wherein the first portion of the first conductive foil is coupled to the first doped polysilicon regions of the first solar cell, and wherein the second portion of the first conductive foil extends beyond an edge of the substrate of the first solar cell;
    a second solar cell coupled to a second conductive foil and comprising second doped polysilicon regions disposed over or on a back side of a substrate of the second solar cell, wherein the second conductive foil includes a single layer of material having a first portion and a second portion, wherein the first portion of the second conductive foil is coupled to the second doped polysilicon regions of the second solar cell, and wherein the second portion of the second conductive foil extends beyond an edge of the substrate of the second solar cell, the side of the second solar cell corresponding to the back side of first solar cell, and wherein the second portion of the first conductive foil overlaps the second portion of the second conductive foil;
a plurality of joints between and directly coupling the second portion of the first conductive foil and the second portion of the second conductive foil, wherein the plurality of joints is along a line parallel to the spacing between the substrate of the first solar cell and the substrate of the second solar cell, the plurality of joints along an axis between and parallel with adjacent edges of the first solar cell and the second solar cell; and
a cutout through the second portion of the first conductive foil and the second portion of the second conductive foil, the cutout intervening between a first of the plurality of joints and a second of the plurality of joints along the axis, and the cutout having a lateral width between the adjacent edges of the first solar cell and the second solar cell that is greater than an extent of overlap of the second portion of the first conductive foil and the second portion of the second conductive foil between the adjacent edges of the first solar cell and the second solar cell from a plan view perspective.

9. The PV string of claim 8 further comprising:
a third portion of the first conductive foil, the third portion extending from the edge of the first solar cell;
a third portion of the second conductive foil, the third portion extending from the edge of the second solar cell; and
one or more joints coupling the third portion of the first conductive foil and the third portion of the second conductive foil.

10. The PV string of claim 8, wherein the first conductive foil has a thickness of less than or equal to 50 microns.

11. The PV string of claim 8, wherein the second portion of the first conductive foil extends less than 2 mm past the edge of the first solar cell.

12. The PV string of claim 8, wherein the first conductive foil includes aluminum.

13. The PV string of claim 8, further comprising:
a gap between the first solar cell and the second solar cell.

14. The PV string of claim 8, wherein the plurality of joints comprises a region selected from a group consisting of a weld region, a solder region and a thermally compressed region.

15. A photovoltaic ("PV") string, comprising:
a first solar cell coupled to a first conductive foil and comprising first doped polysilicon regions disposed over or on a back side of a substrate of the first solar cell, wherein the first conductive foil includes a single layer of material having a first portion and a second portion, wherein the first portion of the first conductive foil is coupled to the first doped polysilicon region of the first solar cell, and wherein the second portion of the first conductive foil extends beyond an edge of the substrate of the first solar cell;
a second solar cell coupled to a second conductive foil and comprising second doped polysilicon regions disposed over or on a back side of a substrate of the second solar cell, wherein the second conductive foil includes a single layer of material having a first portion and a second portion, wherein the first portion of the second conductive foil is coupled to the second doped polysilicon regions of the second solar cell, and wherein the second portion of the second conductive foil extends beyond an edge of the substrate of the second solar cell, and wherein the second portion of the first conductive foil overlaps the second portion of the second conductive foil;
an interconnect structure comprising the second portion of first conductive foil and the second portion of the second conductive foil, wherein a plurality of joints are between and directly couple the second portion of the first conductive foil to the second portion of the second conductive foil, wherein the plurality of joints is along a line parallel to the spacing between the substrate of the first solar cell and the substrate of the second solar cell, the plurality of joints along an axis between and parallel with adjacent edges of the first solar cell and the second solar cell; and
a cutout through the second portion of the first conductive foil and the second portion of the second conductive foil, the cutout intervening between a first of the plurality of joints and a second of the plurality of joints along the axis, and the cutout having a lateral width between the adjacent edges of the first solar cell and the second solar cell that is greater than an extent of overlap of the second portion of the first conductive foil and the second portion of the second conductive foil between the adjacent edges of the first solar cell and the second solar cell from a plan view perspective.

16. The PV string of claim 15 further comprising:
a third portion of the first conductive foil, the third portion extending from the edge of the first solar cell;
a third portion of the second conductive foil, the third portion extending from the edge of the second solar cell; and
wherein the interconnect structure comprises the third portion of the first conductive foil and the third portion of the second conductive foil, one or more joints coupling the third portion of the first conductive foil and the third portion of the second conductive foil.

17. The PV string of claim 15, wherein the first conductive foil has a thickness of less than or equal to 50 microns.

18. The PV string of claim 15, wherein the first conductive foil includes aluminum.

19. The PV string of claim 15, further comprising:
a gap between the first solar cell and the second solar cell.

20. The PV string of claim 15, wherein the plurality of joints comprises a region selected from a group consisting of a weld region, a solder region and a thermally compressed region.

21. The PV string of claim 1, wherein the second portion of the first conductive foil bends along a first non-zero angle relative to the first portion of the first conductive foil, the second portion of the second conductive foil bends along a second non-zero angle relative to the first portion of the second conductive foil, and the second portions of the conductive foils are joined such that the joints are angled with respect to the first portions of the first and second conductive foils.

* * * * *